United States Patent [19]

Dailing

[11] 4,163,959
[45] Aug. 7, 1979

[54] MONOLITHIC CRYSTAL FILTER DEVICE
[75] Inventor: James L. Dailing, Plantation, Fla.
[73] Assignee: Motorola, Inc., Schaumburg, Ill.
[21] Appl. No.: 860,918
[22] Filed: Dec. 15, 1977
[51] Int. Cl.$^2$ .................. H03H 9/02; H03H 9/26; H03H 9/32; H01L 41/04
[52] U.S. Cl. .................................... 333/191; 310/366
[58] Field of Search ................ 333/72, 71; 310/320, 310/365, 366

[56] References Cited
U.S. PATENT DOCUMENTS

| | | | |
|---|---|---|---|
| 2,248,776 | 7/1941 | Och | 333/72 |
| 2,323,610 | 7/1943 | Koch | 310/366 |
| 4,006,437 | 2/1977 | Simpson et al. | 333/72 |

Primary Examiner—Alfred E. Smith
Assistant Examiner—Marvin Nussbaum
Attorney, Agent, or Firm—Donald B. Southard; James W. Gillman

[57] ABSTRACT

An improved monolithic crystal filter arrangement is disclosed wherein a monolithic crystal filter device is formed on a wafer of quartz crystal, or other piezoelectric material, with two pairs of electrodes thereon, each pair cooperating with the wafer to form a resonating portion. Each pair of electrodes include an active electrode, i.e., input or output, and a ground electrode. The input and output electrodes are formed end-wise on alternate sides of the crystal wafer with the ground electrodes, likewise on alternate wafer sides, positioned along an axis perpendicular to that of the active electrodes and in a location so that at least a portion of each thereof extend into the gap between the in-board ends of the active electrodes.

6 Claims, 11 Drawing Figures

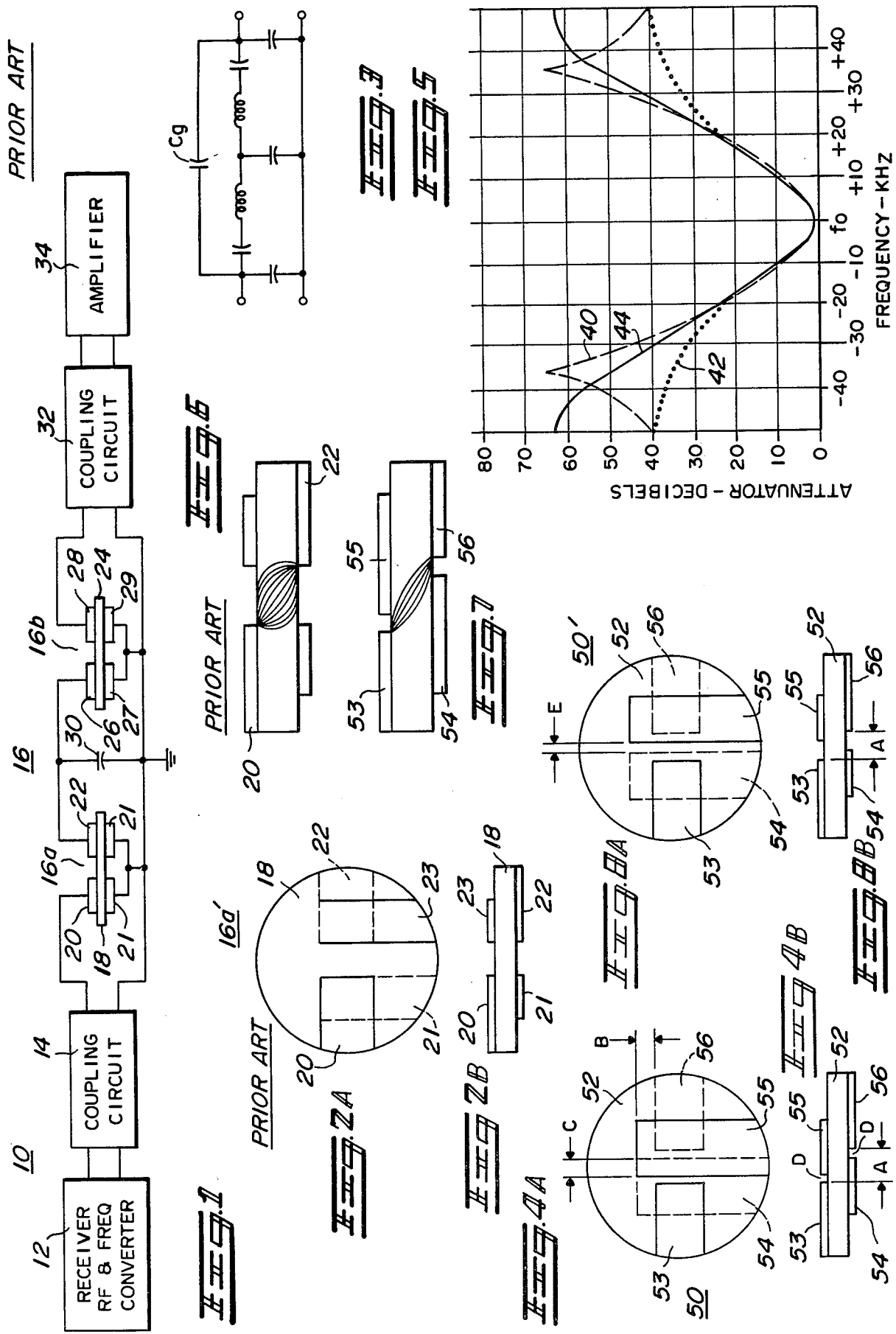

MONOLITHIC CRYSTAL FILTER DEVICE

BACKGROUND OF THE INVENTION

The present invention relates in general to crystal filters and, more particularly, to an improved monolithic crystal filter device which eliminates transmission zeros giving rise to undesirable flyback and provides a significant improvement in the ultimate attenuation of the filter device.

Bandpass filter circuits comprising monolithic crystal filter elements have been used frequently in the past since they provide a high degree of selectivity in a relatively compact arrangement. Such monolithic crystal filters have found particularly advantageous use in the front end circuitry of small, hand-held radio receivers where high selectivity is required but space is at a premium.

A problem, however, in monolithic crystal filters heretofore has been that a significant level of capacity exists between input and output electrodes giving rise to transmission zeros and, consequently, undesirable fly back in the attenuation characteristic thereof. In the past, some reduction in the inherent capacity has been realized by the expedient of reversing one pair of electrodes with respect to the other. That is, by including input and output electrodes on opposing sides of the quartz wafer blank. This, in turn, results in the respective ground electrodes likewise being positioned on alternate sides of the crystal blank. The resulting configuration, while permitting a modest improvement of a few db, nevertheless leaves a good deal to be desired and does not approach desired operating level consonant with modern day technology.

Accordingly, it is an object of the present invention to provide a monolithic crystal filter device with improved overall attenuation characteristics.

A more particular object of the present invention is to provide an improved two-pole monolithic crystal filter device exhibiting a substantial improvement in flyback and ultimate attenuation level of the filter device.

Another object of the present invention is to provide an improved monolithic crystal filter having input and output electrodes which are substantially shielded from one another so as to reduce inherent capacity therebetween and to effect the desired improvement in operating characteristics.

Still another object of the present invention is to provide an improved monolithic crystal filter where not only are the input and output electrodes dimensioned and positioned on the crystal blank to optimize operating characteristics, but wherein the ground electrodes are utilized to play a significant role in such optimized operating levels.

In practicing the invention, a monolithic crystal filter device is provided having a pair of electrodes formed on a single quartz crystal wafer. The electrode pairs, in conjunction with the piezoelectric material of the wafer, form two resonating portions.

Each electrode pair comprises an input or output electrode, as the case may be, in conjunction with an associated ground electrode. The active electrodes are positioned on opposing sides of the quartz wafer end to end with a central gap therebetween. The ground electrodes are likewise positioned on opposing sides of the quartz wafer along an axis essentially perpendicular to the axis of the active electrodes. Further, the ground electrodes are positioned to overlie an end portion of its respective input or output electrode and to extend into the central gap separating the in-board end of the respective active electrodes. In the preferred embodiment, the ground electrodes extend into the interelectrode gap to an extent whereby respective portions on the opposing sides of the wafer blank overlie one another.

BRIEF DESCRIPTION OF THE DRAWINGS

The features of the present invention which are believed to be novel are set forth with particularity in the appended claims. The invention itself, however, together with further objects and advantages thereof, may be best understood by reference to the following description when taken into conjunction with the accompanying drawings, in which like reference numerals refer to like elements in the several figures, and in which:

FIG. 1 is a block diagram of the front end of a radio receiver incorporating a typical crystal filter circuit;

FIGS. 2a and 2b are diagrammatic representations of a crystal filter known in the prior art;

FIG. 3 is a schematic representation of the equivalent circuit for the crystal filter of FIGS. 1 and 2;

FIGS. 4a and 4b are diagrammatic representations of an improved monolithic crystal filter which has been constructed in accordance with the present invention;

FIG. 5 shows the response characteristic which may be expected from those monolithic crystal filters known in the art and that of the improved filter device of the present invention;

FIG. 6 is a diagrammatic representation of the flux linkage that may be expected with the configuration of crystal filter shown in FIG. 2;

FIG. 7 is a diagrammatic representation of the flux linkage that may be expected in the improved crystal filter structure as shown in FIG. 4; and FIGS. 8a and 8b are diagrammatic representations of an alternate embodiment of a crystal filter in accordance with the present invention.

DETAILED DESCRIPTION OF THE PREFERRED EMBODIMENT

Referring now to the drawings, a typical receiver front end 10 is shown in FIG. 1 embodying a crystal filter circuit of a known configuration. The receiver front end 10 which may include an antenna circuit (not shown), and radio frequency and frequency converting stages 12 receives and amplifies signals and provides the same at a frequency suitable for selection and amplification. A coupling circuit 14 couples the received signals to the dual coupled crystal filter arrangement identified generally at 16. A first crystal element 16a includes a flat wafer 18 of quartz or other piezoelectric material having two pairs of electrodes thereon, the first pair being formed by electrodes 20 and 21, and the second pair by electrodes 22 and 23. Likewise crystal element 16b includes a flat wafer 24 of quartz or other piezoelectric material having two pairs of electrodes thereon, the first pair formed by electrodes 26 and 27 and the second being formed by electrodes 28 and 29.

Signals from coupling circuit 14 are applied to electrode 20 of crystal element 16a and output signals are derived from the electrode 22 which are in turn applied across capacitor 30 and to the second monolithic crystal element 16b. The output signals from the second monolithic crystal 16b are applied through the coupling unit 32 to an amplifier 34, which may be the intermediate frequency amplifier of a radio receiver. The signals from amplifier 34 may then be utilized in the conventional manner, as desired.

Still another embodiment of the crystal filter element $16a'$ known in the prior art is that as shown in FIGS. 2a and 2b. In this embodiment, the crystal element includes the input and output electrodes 20 and 22 on opposing sides of the crystal wafer blank 18 as illustrated. This results in the corresponding ground electrodes 21 and 23 likewise being positioned on alternate sides of the wafer blank 18 as indicated.

In the embodiment as shown in FIGS. 2a–2b, the equivalent electrical circuit of the crystal filter device is that as shown in FIG. 3, which includes a pair of series resonant circuits serially connected to one another with a parallel capacitance from their junction to a reference potential and across the respective input and output terminals, as well as a further capacitance in parallel with the series resonant circuits, as identified generally at $C_g$.

It is the presence of this parameter $C_g$, or interelectrode capacitance, in substantial magnitude that results in transmission zeros appearing in the attenuation characteristic of the crystal filters under consideration, and giving rise to referenced undesirable flyback. This is illustrated in graphic form in FIG. 5. The dashed line 40 in FIG. 5 may be considered as a typical response characteristic for the crystal filter element 16a as shown in FIG. 1. It will be noted that the attenuation level rises substantially symmetrically on both sides of center frequency to a maximum of approximately 65 db at around the 35 kHz and then falls back to a level of approximately 40 db constituting the ultimate attenuation for the filter device. The peaks at the 65 db maximum, or the transmission zero points, together with the fall back in attenuation level, represents the previously referenced flyback phenomenon.

The attenuation characteristic can be improved somewhat by the configuration as depicted in FIGS. 2a and 2b for crystal element $16a'$. That is, by positioning the input and output electrodes 20 and 22 on alternate sides of the wafer blank 18, a response characteristic on the order of that as shown in dotted line 42 in FIG. 5 may be expected. Note that the undesirable transmission zeros and flyback characteristics have been substantially eliminated. However, note also that it does not improve the ultimate attenuation level (approximately 40 db) and the overall response characteristic is somewhat broader.

The solid line 44 in FIG. 5, on the other hand, represents the relative improvement that may be expected in a monolithic crystal filter element device as constructed in accordance with the present invention. Transmission zeros and flyback problems are eliminated entirely; the response characteristic is sharpened; and there is an improvement in the ultimate attenuation characteristic of at least 20 db.

In practicing the invention, a monolithic crystal filter element 50 may be provided substantially as shown in FIGS. 4a and 4b, which comprises a crystal wafer blank 52 of quartz or other piezoelectric material, on which input and output electrodes, identified generally at 53 and 56, are plated on opposite sides of the blank 52, along with ground electrodes 54 and 55. However, in this case, the ground electrodes 54 and 55 are so positioned on alternate wafer sides so that at least a portion thereof extends into the gap as defined by the in-board ends of he active electrodes 53 and 56. In the preferred embodiment, and as shown in FIGS. 4a and 4b, the ground electrodes 54 and 55 are positioned so that portions thereof overlie one another along a respective longitudinal edge, substantially as depicted. The gap between the active electrode and adjacent planar ground electrode, i.e. between electrodes 53 and 55 and between 54 and 56, identified at "D" in FIG. 4b, is relatively narrow as compared to the gap between the active electrodes themselves, i.e., between electrodes 53 and 56, identified at "A", FIG. 4b. In the preferred embodiment of FIG. 4a, the ground electrodes also extend upwardly beyond the longitudinal edge of the active electrodes 53 and 56, identified at "B", FIG. 4a.

In this configuration, the ground electrodes, 54 and 55, by extending laterally into the gap A between active electrodes effects a substantial shielding effect therebetween so as to effectively minimize the interelectrode capacitance $C_g$ as shown in FIG. 3. As may be appreciated, this is a most important aspect of the invention and is depicted graphically in FIGS. 6 and 7. In FIG. 6, corresponding to the prior art embodiment of FIGS. 2a and 2b, the flux lines will extend between input and output electrodes 20 and 22 substantially as shown, and occupying substantially the entire gap area extending between such electrodes. In FIG. 7, corresponding to the embodiment of the invention as shown in FIGS. 4a and 4b, the ground electrodes 54 and 55 extend laterally into the interelectrode gap between the active electrodes 53 and 56 and the flux can now occupy only a substantially reduced area, as depicted, and thereby provide the shielding effect previously mentioned.

It should be noted that it is not necessary in order to obtain the advantages of the present invention that the ground electrodes extend into the active interelectrode gap to an extent that they overlap one another, and as depicted in FIGS. 4a and 4b. An alternate embodiment of the invention is shown in FIGS. 8a and 8b. In this embodiment the ground electrodes 54 and 55 extend into the interelectrode gap area between active electrodes 53 and 56 only part way, but nevertheless, sufficiently and to an extent to provide a sufficient degree of the shielding effect for the active electrodes as previously mentioned.

In an embodiment in accordance with the invention as depicted in FIGS. 4a and 4b, electrodes 53 and 56 and also 54 and 55 were plated on the wafer blank 52 as previously described with a width dimension of approximately 70 mils. The gap between the in-board ends of the active electrodes 53 and 56, designated "A" in FIG. 4, was approximately 10 mils. The ground electrodes 54 and 55 extended upwardly beyond the limits of the active electrodes, designated "B" in FIG. 4a, approximately 52.5 mils. Further, each of the ground electrodes 54 and 55 extended into the interelectrode gap A approximately 7.5 mils, thereby resulting in a ground electrode overlap, designated "C" in FIG. 4a, of approximately 5 mils, and an active electrode adjacent ground electrode gap, "D" in FIG. 4b, of approximately 2.5 mils.

In the embodiment of FIGS. 8a and 8b, the dimensions were the same as that described for FIGS. 4a and 4b, with the exception that each of the ground electrodes 54 and 55 extended into the interelectrode gap A approximately 4 mils, leaving a central gap "E" between the edges of the ground electrodes 54 and 55 of approximately 2 mils.

While only particular embodiments of the present invention have been shown and described, it will of course be obvious to those skilled in the art and various changes and modifications may be made without departing from the invention in its broader aspects. Accordingly, the appended claims are intended to cover all such modifications and alternative constructions that may fall within the true scope and spirit of the invention.

What is claimed is:

1. An improved monolithic crystal filter device comprising in combination:

a monolithic wafer body of piezoelectric material;

an essentially rectangular input electrode deposited on one side of said wafer body and an essentially rectangular output electrode deposited on the other side of said waver body in substantial alignment longitudinally with said input electrode and with a gap provided between the inboard ends of said input and output electrodes;

a pair of essentially rectangular ground electrodes, each deposited on alternate sides of said wafer body in associatation with a respective one of said input and output electrodes, said ground electrodes being deposited with the longitudinal axis thereof substantially perpendicular to the longitudinal axis of said input and output electrodes, said ground electrodes being positioned on said wafer body to overlie and extend beyond the extremities of an inboard end of a respective one of said input and output electrode and so that a lateral portion of each of said ground electrodes extends into said gap formed by said inboard ends of said input and output electrodes to provide a shielding effect therebetween.

2. An improved monolithic crystal filter device in accordance with claim 1 wherein said ground electrodes are positioned to extend beyond the lateral limits of both said input and output electrodes.

3. An improved monolithic crystal filter device in accordance with claim 1 wherein said ground electrodes are positioned to extend into said interelectrode gap between said input and output electrodes so that a portion of said ground electrodes along a lateral edge thereof overlap one another.

4. An improved monolithic crystal filter device in accordance with claim 3 wherein each of said electrodes has a lateral dimension of approximately 70 mils, said interelectrode gap is approximately 10 mils, and said ground electrodes overlap one another over an area of approximately 5 mils wide.

5. An improved monolithic crystal filter device in accordance with claim 1 wherein said ground electrodes are positioned to extend into said interelectrode gap between said input and output electrodes and wherein the lateral edges of said ground electrodes are in a non-overlapping relation.

6. An improved monolithic crystal filter device in accordance with claim 5 wherein each of said electrodes has a lateral dimension of approximately 70 mils, said interelectrode gap is approximately 10 mils, and wherein said ground electrodes extend into said interelectrode gap between said input and output electrodes a distance of at least 4 mils.

* * * * *